US012341086B2

(12) United States Patent
Yoon et al.

(10) Patent No.: US 12,341,086 B2
(45) Date of Patent: Jun. 24, 2025

(54) LEAD FRAME

(71) Applicant: HAESUNG DS CO., LTD., Gyeongsangnam-do (KR)

(72) Inventors: Dong Jin Yoon, Gyeongsangnam-do (KR); Sung Il Kang, Gyeongsangnam-do (KR); In Seob Bae, Gyeongsangnam-do (KR); Seok Kyu Seo, Gyeongsangnam-do (KR); Dong Young Pyeon, Gyeonggi-do (KR)

(73) Assignee: HAESUNG DS CO., LTD, Gyeongsangnam-Do (KR)

( * ) Notice: Subject to any disclaimer, the term of this patent is extended or adjusted under 35 U.S.C. 154(b) by 380 days.

(21) Appl. No.: 17/930,537

(22) Filed: Sep. 8, 2022

(65) Prior Publication Data

US 2023/0102887 A1 Mar. 30, 2023

(51) Int. Cl.
*H01L 23/495* (2006.01)
*H01L 21/48* (2006.01)
*H01L 21/56* (2006.01)

(52) U.S. Cl.
CPC ...... *H01L 23/49565* (2013.01); *H01L 21/565* (2013.01); *H01L 23/49503* (2013.01); *H01L 23/49548* (2013.01)

(58) Field of Classification Search
CPC ......... H01L 23/49548; H01L 23/49562; H01L 23/49503; H01L 21/565; H01L 21/4842
See application file for complete search history.

(56) References Cited

U.S. PATENT DOCUMENTS

| | | | |
|---|---|---|---|
| 6,773,961 B1 * | 8/2004 | Lee | H01L 21/566 438/114 |
| 9,184,120 B1 * | 11/2015 | Babaran | H01L 23/49582 |
| 10,930,581 B2 | 2/2021 | Ziglioli | |
| 2009/0283884 A1 * | 11/2009 | Kang | H01L 24/83 257/676 |
| 2015/0194323 A1 * | 7/2015 | Kang | H01L 23/49827 216/14 |
| 2019/0267315 A1 * | 8/2019 | Bae | H01L 21/76802 |

FOREIGN PATENT DOCUMENTS

| | | | |
|---|---|---|---|
| CN | 1767186 | 5/2006 | |
| CN | 1879217 | 12/2006 | |
| CN | 101345227 | 1/2009 | |
| EP | 3442018 A1 * | 2/2019 | ......... H01L 21/4821 |

* cited by examiner

*Primary Examiner* — Walter H Swanson
*Assistant Examiner* — Jacob T Nelson
(74) *Attorney, Agent, or Firm* — Perman & Green, LLP

(57) ABSTRACT

A lead frame includes: leads; and a dambar arranged between the leads and connecting the leads to each other, wherein each of the leads includes: a lower lead groove formed in a first surface for a wettable flank structure; and an upper lead groove formed in a second surface opposite the first surface and aligned with the lower lead groove in a thickness direction, wherein in a sawing process, a portion of the lead between the lower lead groove and the upper lead groove is at least partially removed.

4 Claims, 5 Drawing Sheets

LEAD FRAME

CROSS-REFERENCE TO RELATED APPLICATION

This application is based on and claims priority under 35 U.S.C. § 119 to Korean Patent Application No. 10-2021-0129169, filed on Sep. 29, 2021, in the Korean Intellectual Property Office, the disclosure of which is incorporated by reference herein in its entirety.

BACKGROUND

1. Field

One or more embodiments relate to a lead frame.

2. Description of the Related Art

Lead frames, which are metal plates for placing semiconductor chips thereon, are widely used for manufacturing semiconductor packages.

Recently, techniques relating to a wettable flank structure have been actively developed to improve mounting reliability in semiconductor packages.

The wettable flank structure refers to a structure in which portions of edge of a lead frame are cut off to form sufficient solder fillets on lead bonding portions, and an inspector may easily evaluate the mounting reliability of a semiconductor package by inspecting the exterior of the wettable flank structure.

Lead frames having the wettable flank structure may be classified into two types: a step-cut type in which steps are formed on leads; and a hollow-groove type in which grooves are formed in leads.

Because steps or grooves formed in lead frames having the wettable flank structure decreases the rigidity of the lead frames, the thickness and shape of dambars are designed for securing sufficient rigidity. That is, when dambars supporting leads do not have sufficient rigidity, lead frames may be bent, and thus semiconductor packages may not be properly manufactured.

U.S. patent Ser. No. 10/930,581 discloses a semiconductor package, which includes a wettable conductive layer covering an encapsulation material.

SUMMARY

One or more embodiments include a lead frame having an improved structure.

Additional aspects will be set forth in part in the description which follows and, in part, will be apparent from the description, or may be learned by practice of the presented embodiments of the disclosure.

According to one or more embodiments, a lead frame includes: leads; and a dambar arranged between the leads and connecting the leads to each other, wherein each of the leads includes: a lower lead groove formed in a first surface for a wettable flank structure; and an upper lead groove formed in a second surface opposite the first surface and aligned with the lower lead groove in a thickness direction, wherein in a sawing process, a portion of the lead between the lower lead groove and the upper lead groove is at least partially removed.

The lower lead groove may be formed in a state in which a support resin is provided in the upper lead groove.

A length of the upper lead groove may be greater than a length of the lower lead groove.

A width of the upper lead groove may be greater than a width of the lower lead groove.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
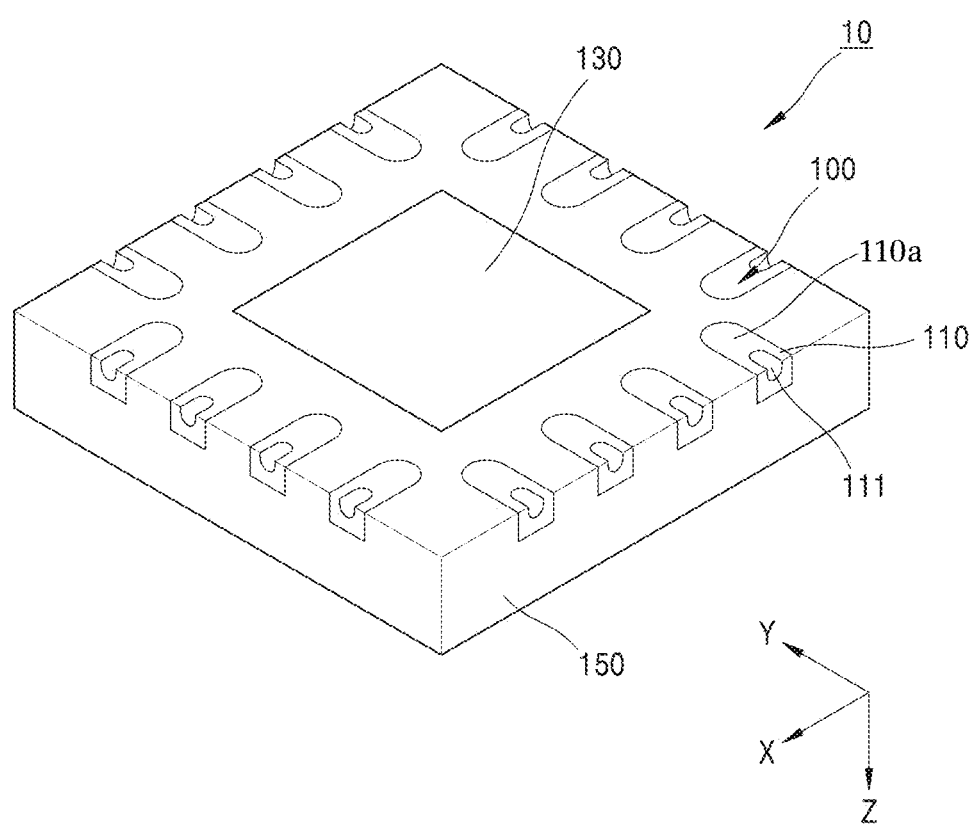
FIG. 1 is a schematic perspective view illustrating a bottom surface of a semiconductor package according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described with reference to the accompanying drawings. In the detailed description and the drawings, like reference numerals denote like elements, and overlapping descriptions thereof will be omitted. Furthermore, in the drawings, the sizes of elements, the length ratios of elements, or the like may be exaggerated for clarity of illustration.

Aspects of the present disclosure will be clarified through the accompanying drawings and descriptions of embodiments. The embodiments may, however, have different forms and should not be construed as being limited to the descriptions set forth herein. Rather, these embodiments are provided such that this disclosure will be thorough and complete, and will fully convey the scope of the inventive concept to those skilled in the art. Therefore, the scope of the present disclosure should be defined by the following claims.

In the following description, technical terms are used only for explaining embodiments, and not for purposes of limitation. Terms in the singular form may include the plural form unless specifically mentioned. The meaning of "comprises" and/or "comprising" specifies an element, a step, a process, an operation, and/or a device but does not exclude other elements, steps, processes, operations, and/or devices. It will be understood that although terms such as first, second, upper surface, and lower surface are used herein to describe various elements, these elements should not be limited by these terms. These terms are only used to distinguish one element from other elements.

Figure 2:
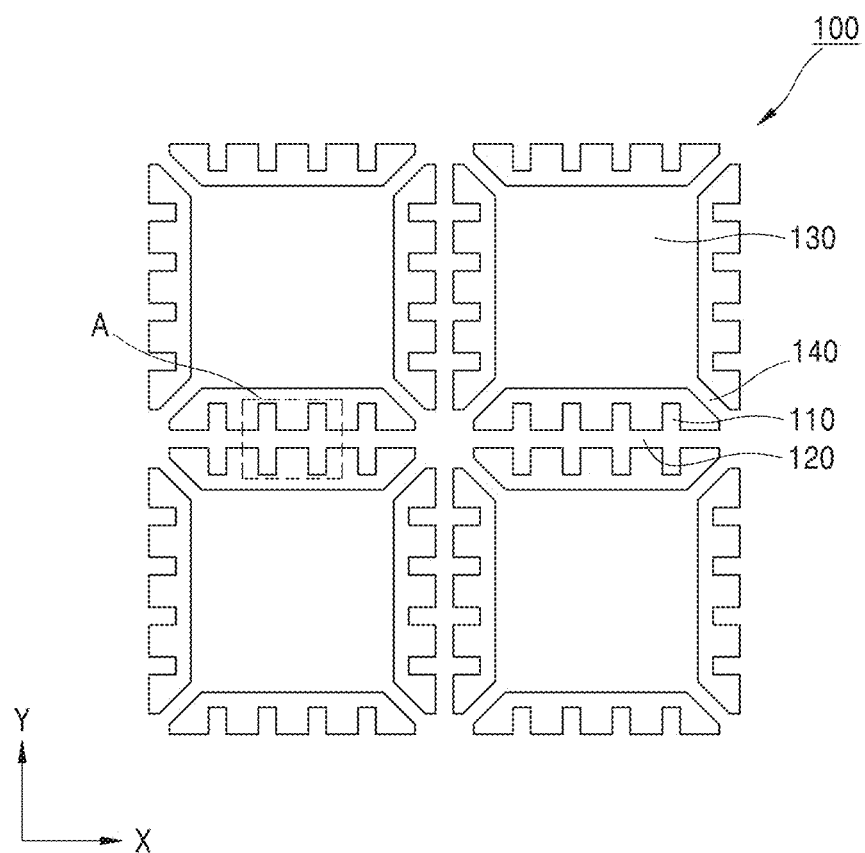
FIG. 2 is a schematic plan view illustrating a lead frame according to an embodiment.
Figure 3:
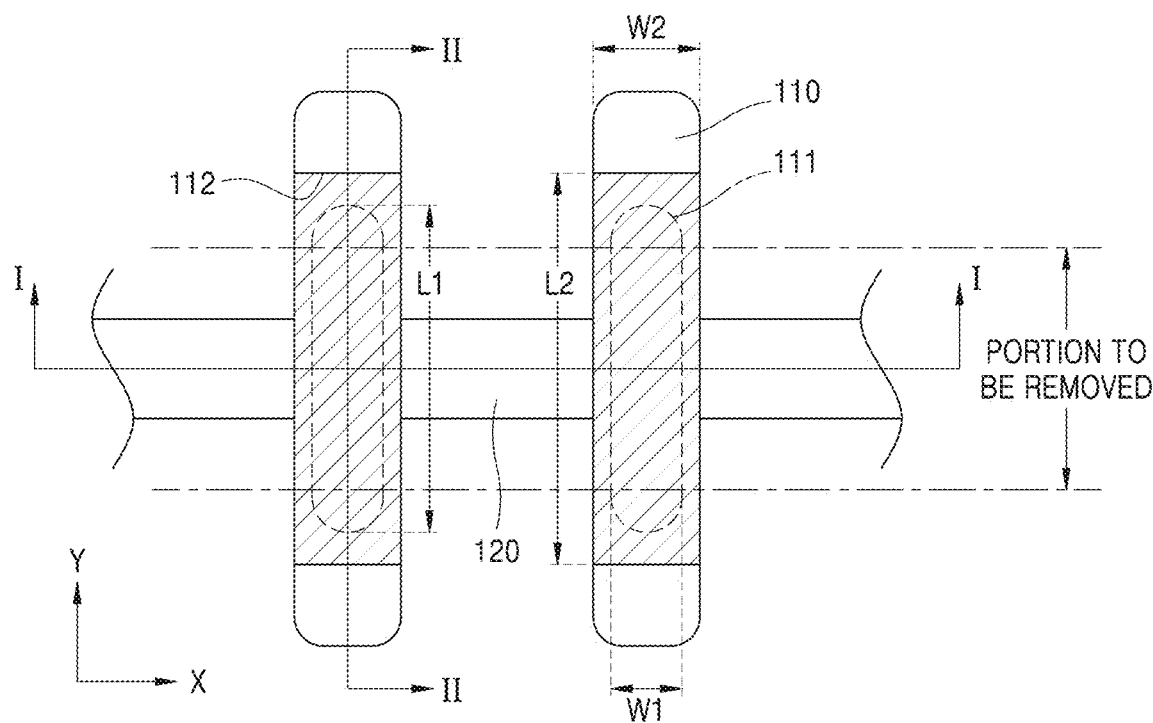
FIG. 3 is a schematic enlarged view of portion A of FIG. 2.
Figure 4:
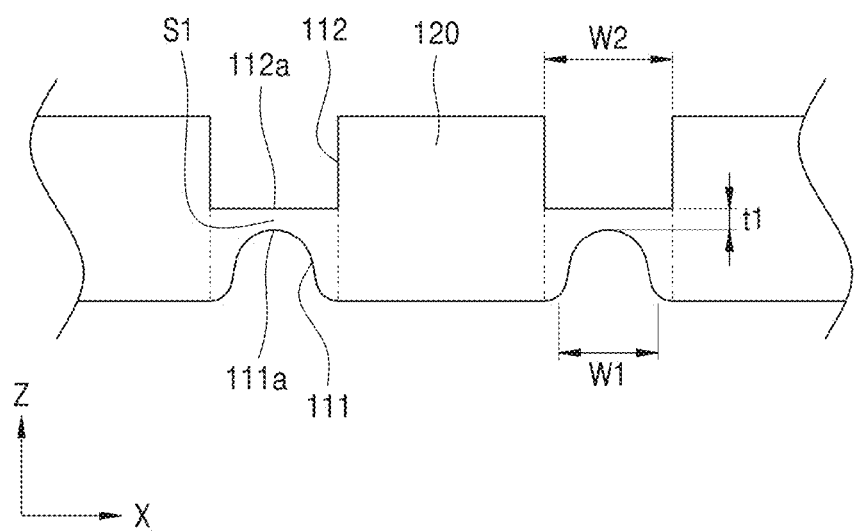
FIG. 4 is a schematic cross-sectional view taken along line I-I of FIG. 3.
Figure 5:
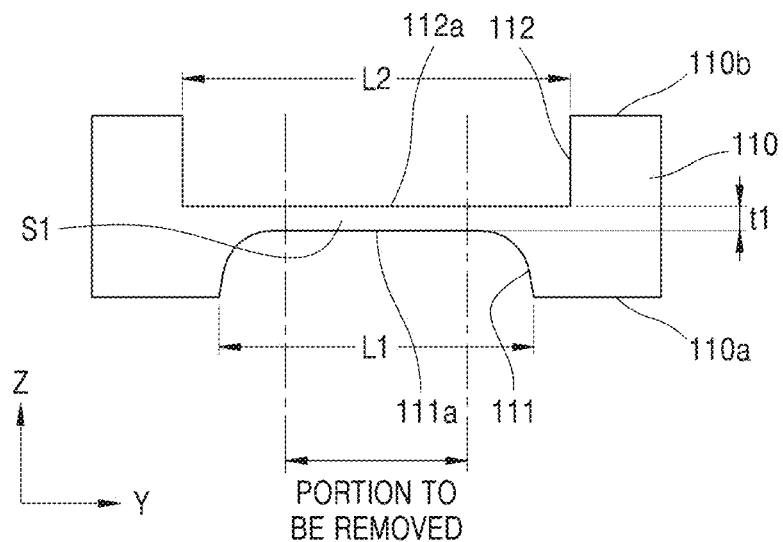
FIG. 5 is a schematic cross-sectional view taken along line II-II of FIG. 3.

FIG. 1 is a schematic perspective view illustrating a bottom surface of a semiconductor package 10 according to an embodiment. FIG. 2 is a schematic plan view illustrating a lead frame 100 according to an embodiment, FIG. 3 is a schematic enlarged view of portion A of FIG. 2, FIG. 4 is a schematic cross-sectional view taken along line I-I of FIG. 3, and FIG. 5 is a schematic cross-sectional view taken along line II-II of FIG. 3.

As shown in FIG. 1, according to an embodiment, the semiconductor package 10 includes the lead frame 100 having a wettable flank structure. That is, the lead frame 100 having a wettable flank structure includes leads 110 in which lower lead grooves 111 are formed. The lower lead grooves 111 are formed in first surfaces 110a of the leads 110 such that solder fillets may be sufficiently formed when the semiconductor package 10 is mounted on a board.

Referring to FIG. 2, according to an embodiment, the lead frame 100 includes the leads 110, dambars 120, a die pad 130, and pad support portions 140.

The shapes of the leads 110, the dambars 120, the die pad 130, and the pad support portions 140 of the lead frame 100 may be formed by etching a base metal material. Here, iron, an iron alloy, nickel, a nickel alloy, alloy 42, copper, a copper alloy, or the like may be used as the base metal material. The base metal material may be etched to form the lead frame 100 by a method of related art such as a wet etching method or a dry etching method. The wet etching method may use a liquid etchant, and the dry etching method may use a reactive gas, ions, or the like as an etchant.

The leads 110 are parallel to each other.

Referring to FIGS. 3, 4, and 5, the lower lead grooves 111 are formed in the first surfaces 110a of the leads 110, and upper lead grooves 112 are formed in second surfaces 110b of the leads 110, which are opposite the first surfaces 110a. The lower lead grooves 111 and the upper lead grooves 112 may be formed by an etching method or the like.

The lower lead grooves 111 are formed in the first surfaces 110a of the leads 110 to be applied to a wettable flank structure. That is, in a process of mounting the semiconductor package 10 on a board, solder fillets are sufficiently formed by filling the lower lead grooves 111 with solder.

The upper lead grooves 112 are formed in the second surfaces 110b of the leads 110 in alignment with the lower lead grooves 111 in a thickness direction. Therefore, portions 51 between bottom surfaces 112a of the upper lead grooves 112 and bottom surfaces 111a of the lower lead grooves 111 have a very small thickness t1. During a sawing process, the portions 51 of the leads 110 between the upper lead grooves 112 and the lower lead grooves 111 are at least partially removed such that the leads 110 may easily be cut. Thus, the dambars 120 may be reliably removed and separated.

This will now be described.

Portions to be removed in a sawing process are indicated with alternated long and short dash lines in FIG. 3, and because the upper lead grooves 112 reduce the thickness of the leads 110 and thus the volume of the leads 110, the leads 110 may easily be cut. That is, the lower lead grooves 111 are portions for the wettable flank structure, and owing to the upper lead grooves 112 which are formed opposite the lower lead grooves 111 according to an embodiment, the thickness to be removed in the sawing process may be markedly reduced. In this case, burrs may be reduced, and the dambars 120 may be reliably removed. In addition, the lifespan of a sawing blade may also increase.

Here, the length L2 of the upper lead grooves 112 may be greater than the length L1 of the lower lead grooves 111. The length L1 of the lower lead grooves 111 is determined according to the design of the wettable flank structure.

When the length L2 of the upper lead grooves 112 is greater than the length L1 of the lower lead grooves 111, the volume of part to be removed is reduced during the sawing process. In this case, it is possible to smooth the sawing process and reduce the occurrence of burrs.

In addition, the width W2 of the upper lead grooves 112 may be greater than the width W1 of the lower lead grooves 111. The width W1 of the lower lead grooves 111 is determined according to the design of the wettable flank structure.

When the width W2 of the upper lead grooves 112 is greater than the width W1 of the lower lead grooves 111, the volume of part to be removed is reduced during the sawing process. In this case, it is possible to smooth the sawing process and reduce the occurrence of burrs.

In addition, a support resin including an epoxy material, a urethane-based material, a polyimide material, or the like may be provided in the upper lead grooves 112 to supplement the rigidity of the lead frame 100 during additional processes such as a plating process or a groove forming process. For example, the upper lead grooves 112 may be formed first, and the support resin may be provided in the upper lead grooves 112 to supplement the rigidity of the lead frame 100. In this state, the lower lead grooves 111 may be formed. Furthermore, in a packaging process, the upper lead grooves 112 may be coupled to a mold resin 150 to help support the leads 110.

In addition, the dambars 120 have a uniform thickness and are formed between the leads 110. The dambars 120 connect the leads 110 to each other and support the leads 110.

According to an embodiment, the dambars 120 have a uniform thickness, but embodiments are not limited thereto. That is, in other embodiments, the dambars 120 may have at least two thicknesses.

The die pad 130 is portion corresponding to the position of a semiconductor chip, and the pad support portions 140 support the die pad 130.

The mold resin 150 is an encapsulation material, and a general electrical insulating material for the semiconductor package 10 may be used as the mold resin 150. For example, the mold resin 150 may include an epoxy material, a urethane-based material, or the like.

For clearer understanding of the operations and effects described above according to embodiments, a lead frame having a wettable flank structure of the related art will now be described as a comparative example for comparison with the lead frame 100 of the present disclosure.

Figure 6:
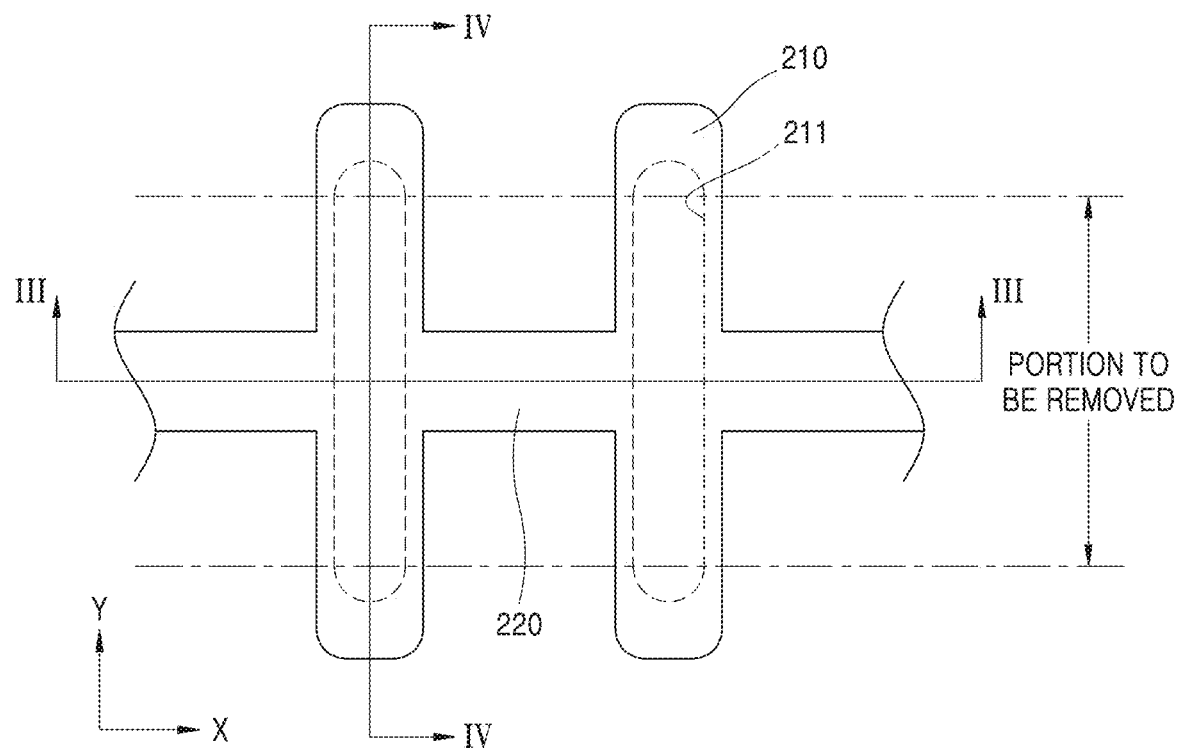
FIG. 6 is a schematic view illustrating leads and a dambar of a lead frame according to a comparative example for comparison with the present disclosure.
Figure 7:
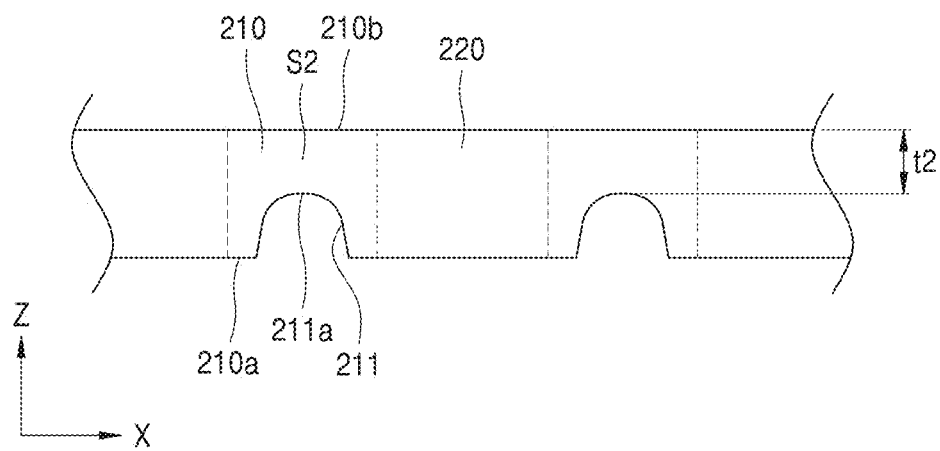
FIG. 7 is a schematic cross-sectional view taken along line III-III of FIG. 6.
Figure 8:
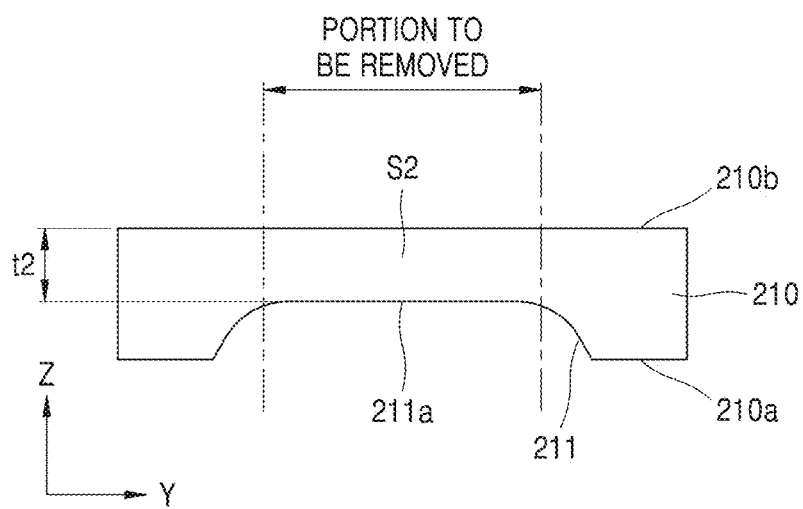
FIG. 8 is a schematic cross-sectional view taken along line IV-IV of FIG. 6.

FIG. 6 is a schematic view illustrating leads 210 and a dambar 220 of a lead frame according to a comparative example for comparison with the present disclosure, FIG. 7 is a schematic cross-sectional view taken along line III-III of FIG. 6, and FIG. 8 is a schematic cross-sectional view taken along line IV-IV of FIG. 6.

FIG. 6 illustrates the leads 210 and the dambar 220 of the lead frame of the comparative example. Lower lead grooves 211 are formed in first surfaces 210a of the leads 210 as shown in FIGS. 7 and 8. The lower lead grooves 211 of the comparative example are substantially the same as the lower lead grooves 111 of the present disclosure, and thus descriptions thereof will be omitted.

Here, the leads 210 of the comparative example include only the lower lead grooves 211, and structures corresponding to the upper lead grooves 112 of the present disclosure are not formed on the leads 210. That is, upper lead grooves are not formed in second surfaces 210b of the leads 210 of the comparative example.

The thickness t2 of portions S2 between the second surfaces 210b of the leads 210 and bottom surfaces 211a of the lower lead grooves 211 in the structure of the comparative example is greater than thickness t1 of the portions 51 between the bottom surfaces 112a of the upper lead grooves 112 and the bottom surfaces 111a of the lower lead grooves 111 of the present disclosure. Thus, in a sawing process, it may be difficult to cut the leads 210, and even after the sawing process, the dambar 220 may not be reliably separated, causing defects.

Unlike the comparative example, the lead frame 100 of the present disclosure includes the upper lead grooves 112 formed opposite the lower lead grooves 111, and thus the leads 110 may easily be cut in a sawing process for separating semiconductors. In addition, the dambars 120 may be reliably removed and separated, and thus the quality of the lead frame 100 may be improved while reducing the occurrence of burrs. In addition, the lifespan of a sawing blade may also be increased.

According to a lead frame according to an aspect of the present disclosure, separation may be easily performed while decreasing the occurrence of burrs in a sawing process for separating semiconductor packages.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

INDUSTRIAL APPLICABILITY

According to embodiments, the lead frame 100 may be applied to the lead frame manufacturing industry.

What is claimed is:
1. A lead frame comprising:
   leads; and
   a dambar arranged between the leads and connecting the leads to each other,
   wherein each of the leads comprises:
      a lower lead groove formed in a first surface and defining a wettable flank structure for receiving solder; and
      an upper lead groove formed in a second surface opposite the first surface, where the upper lead groove is disposed so as to be aligned with the lower lead groove in a thickness direction such that opposing grooves are registered in alignment along a common axis perpendicular to the first and second surface,
      wherein in a sawing process, a portion of the lead between the opposing grooves is at least partially removed.
2. The lead frame of claim 1, wherein the lower lead groove is formed in a state in which a support resin is provided in the upper lead groove.
3. The lead frame of claim 1, wherein a length of the upper lead groove is greater than a length of the lower lead groove.
4. The lead frame of claim 1, wherein a width of the upper lead groove is greater than a width of the lower lead groove.

* * * * *

UNITED STATES PATENT AND TRADEMARK OFFICE
CERTIFICATE OF CORRECTION

| | | |
|---|---|---|
| PATENT NO. | : 12,341,086 B2 | Page 1 of 1 |
| APPLICATION NO. | : 17/930537 | |
| DATED | : June 24, 2025 | |
| INVENTOR(S) | : Yoon et al. | |

It is certified that error appears in the above-identified patent and that said Letters Patent is hereby corrected as shown below:

On the Title Page

Insert --(30) Foreign Application Priority Data - Sep. 29, 2019 (KR)10-2021-0129169--

Signed and Sealed this
Twelfth Day of August, 2025

Coke Morgan Stewart
*Acting Director of the United States Patent and Trademark Office*